United States Patent
Sullivan

(10) Patent No.: US 7,209,936 B2
(45) Date of Patent: Apr. 24, 2007

(54) FREQUENCY LOCKED DIGITALLY TUNED OSCILLATOR SYNTHESIZER

(76) Inventor: William B. Sullivan, P.O. Box 289, Rockaway, NJ (US) 07866

( * ) Notice: Subject to any disclaimer, the term of this patent is extended or adjusted under 35 U.S.C. 154(b) by 711 days.

(21) Appl. No.: 10/701,914

(22) Filed: Nov. 6, 2003

(65) Prior Publication Data

US 2005/0102337 A1    May 12, 2005

(51) Int. Cl.
*G06J 1/00* (2006.01)
*G06F 1/02* (2006.01)

(52) U.S. Cl. .......................... 708/3; 708/271
(58) Field of Classification Search .................. 708/8, 708/271; 327/105, 106
See application file for complete search history.

(56) References Cited

U.S. PATENT DOCUMENTS 5,909,193 A * 6/1999 Phillips et al. .............. 342/410
6,373,344 B1 * 4/2002 Mar ............................ 331/96
7,012,453 B2 * 3/2006 Coleman et al. ............ 327/113

* cited by examiner

Primary Examiner—Tan V. Mai
(74) Attorney, Agent, or Firm—Zachary T. Wobensmith, III

(57) ABSTRACT

A synthesizer is disclosed and is digitally tuned and locked in a measured frequency. The synthesizer uses both the dual voltage control oscillator, each operating over less than an octave, in combination with the microwave doublers to produce a multi-octave RF output with low having low harmonics and free of spurious output signals thereon. The synthesizer uses a sampling downconverter that would, without the benefits of the present invention, produce an ambiguous IF output signal that is translated from the VCO microwave frequency. The ambiguity of the sampling downconverter is corrected by using in-phase and quadrature components of the IF output signal produced by the downconverter along with an Arc Tan to generate a series of digital phase data that is compared against a known reference to eliminate the ambiguity of the VCO frequency. The synthesizer further uses at least one clocking source having an output that is selectively filtered to avoid singularity problems normally plaguing downconverters.

14 Claims, 12 Drawing Sheets

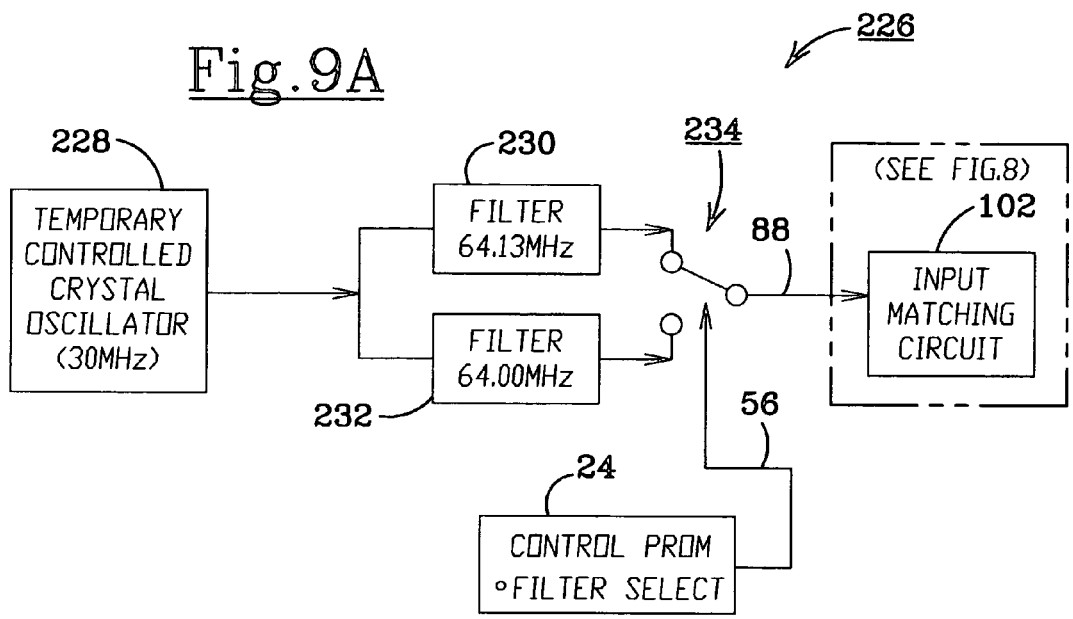
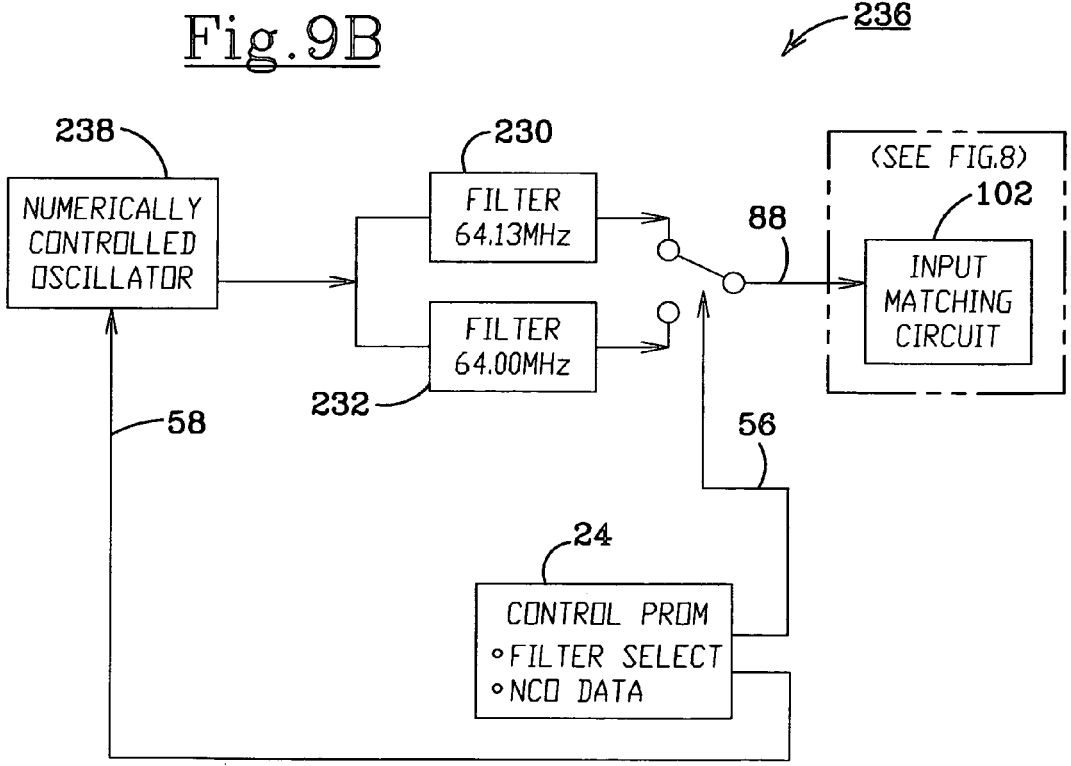

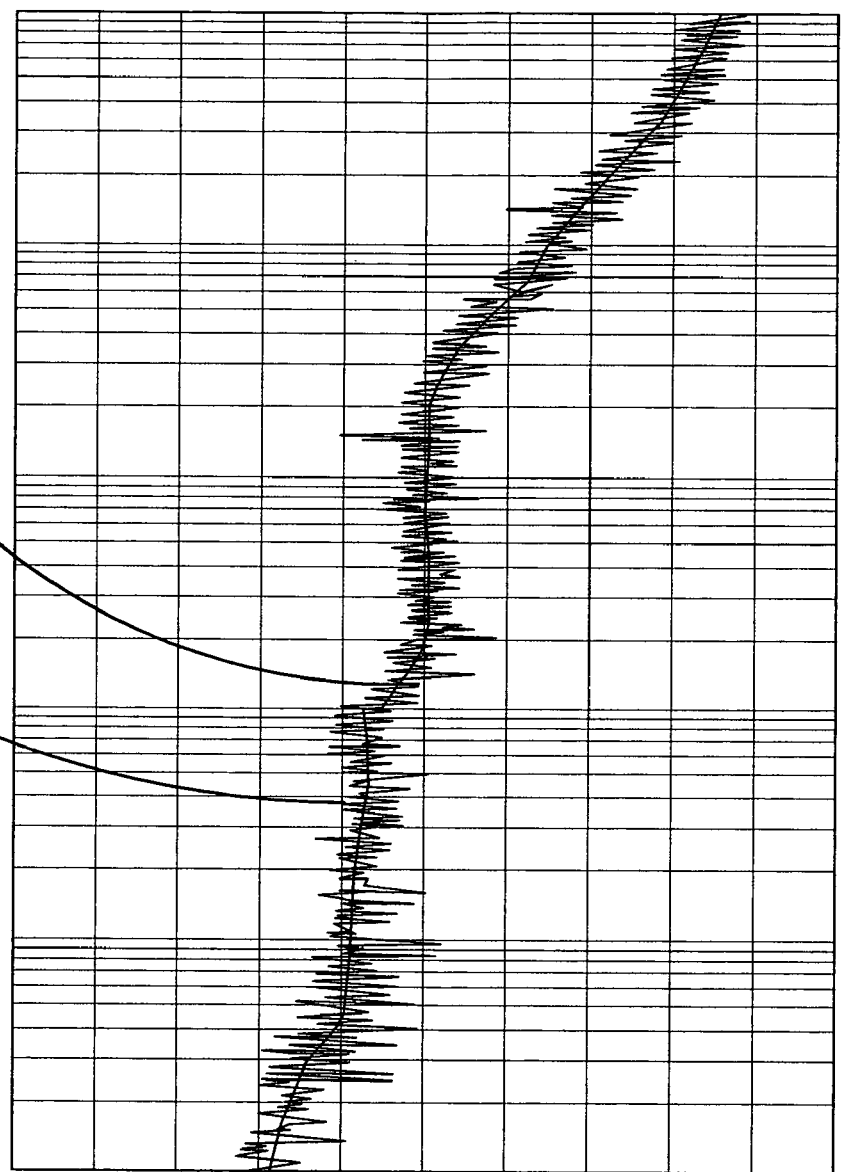

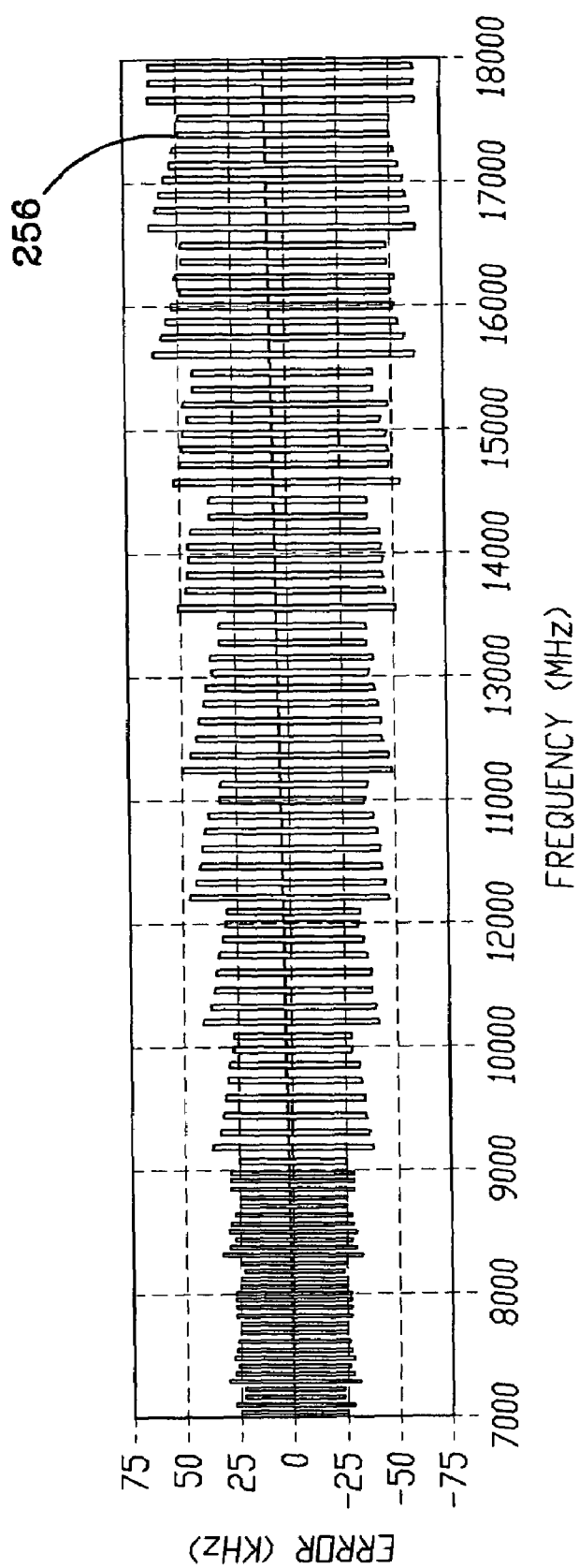

FREQUENCY LOCKED DIGITALLY TUNED OSCILLATOR SYNTHESIZER

CROSS-REFERENCE TO RELATED APPLICATION

This application is related to U.S. patent Ser. No. 10/139,810 entitled "Correlator Stabilized Digitally Tuned Oscillator Synthesizer."

BACKGROUND OF THE INVENTION 1.0 Field of the Invention

The present invention relates to a RF (Radio Frequency) synthesizer and, more particularly, to a frequency locked, digitally tuned RF synthesizer that provides a high speed, broad band, and accurate signal source.

2.0 Description Related to the Prior Art

There are many types of RF (Radio Frequency) synthesizers in present use. These fall into one of four general categories: Phase Locked, YIG tuned, Direct Digital, and Digitally Tuned Oscillator. The phase locked synthesizer usually employs a Voltage Controlled Oscillator (VCO) that is phase locked to some fixed low frequency reference oscillator via either a frequency divider circuit or a narrow band sampling downconverter circuit. The output frequency of the phase locked synthesizer is adjusted by changing the divider circuit characteristics. The phase locked synthesizer design is usually complex, as the frequency divider circuits are required to divide by non-integer ratios, exhibits the frequency stability of the fixed low frequency reference, and, because of the narrow video bandwidths of the phase lock circuit, the phase locked synthesizers tend to be relatively slow in its response (1 ms to 10 ms, typically).

The YIG (Yittrium Iron Garnet) tuned synthesizer provides a wide band (usually up to an octave relative to the input frequency) RF output, and is based on an oscillator using a YIG sphere as a resonator, is oven stabilized, and is tuned by changing the magnetic field applied to the YIG. The accuracy of the YIG tuned synthesizer is poor (typically 0.1% of the output frequency, ±18 MHz at 18 GHz). In addition, the tuning time is relatively slow (100 ms).

The direct digital synthesizer generates an RF output by sequencing through a series of addresses accessed from a RAM (Random Access Memory) that has previously been loaded with a mathematical sine function. The direct digital synthesizer produces a relatively fast RF output, but is limited in frequency resolution and bandwidth. Improvements of the frequency resolution and operating bandwidth typically lead to substantial complexity in the synthesizer design.

The typical digitally tuned oscillator consists of a VCO that is digitally tuned, using a Programmable Read Only Memory (PROM) calibration table to compensate for the nonlinear tuning characteristics of the VCO. To reduce the output frequency error over temperature, the VCO is often oven stabilized. While this produces a fast response (<10 μS), achievement of output frequency accuracy's on the order of 1 MHz requires extensive calibration. Further, the oven stabilization leads to a long-term frequency drift, requiring occasional recalibration. It is desired to provide a RF synthesizer that does not suffer the drawbacks of the prior art. More particularly, it is desired to provide a RF synthesizer having a high speed and a broad band, and serves as an accurate signal source having long term frequency stability.

OBJECTS OF THE INVENTION

It is an object of the present invention to provide a RF synthesizer having a quick response, and a broad band, and provides an accurate signal source having long term frequency stability.

It is another object of the present invention to provide a frequency locked, digitally tuned RF synthesizer having a quick response and broad band, and provides an accurate signal source having long term frequency stability.

Another object of the present invention is to provide a frequency locked, digitally tuned RF synthesizer utilizing dual VCOs, each operating over less than an octave of an incoming RF signal, in combination with microwave doublers and dividers, to produce a multi-octave RF output with low harmonic and spurious outputs.

Further, it is another object of the present invention to provide a frequency locked, digitally tuned RF synthesizer utilizing sampling downconverter producing an ambiguous wideband output that is translated from the VCO microwave frequency and is used to provide for a more accurate signal source.

Still further, it is an object of the present invention to provide a frequency locked, digitally tuned RF synthesizer utilizing the use of I and Q digitization function of Quad Hybrid device and an Arc Tan PROM to generate a serial stream of digital phase data, then use a comparison of adjacent phase measurements to estimate the ambiguous VCO frequency so as to provide accurate open loop pre-tuning the VCO removed the ambiguity of the VCO.

Moreover, it is an object of the present invention to provide a frequency locked, digitally tuned RF synthesizer utilizing different filter arrangements to avoid disadvantageous singularities problems in the sampling downconverter IF output at the sampling frequency.

SUMMARY OF THE INVENTION

The invention is directed to a synthesizer that is digitally tuned so as to lock on at a measured frequency.

The digitally tuned synthesizer comprises a) a register for receiving a digital word having a predetermined number of bits; b) a partitioner interconnected to the register for partitioning the predetermined number of bits of the digital word into coarse and fine control words; c) a first digital to analog converter connected to said coarse control word and providing an output representative of said coarse control word. The digitally tuned synthesizer further comprises; d) a combiner having first and second inputs receiving signals and an output representative of the sum of the signals received on the first and second inputs; the first input being connected to the output of the first digital to analog converter; e) at least one voltage controlled oscillator having a first input connected to the output of the combiner and providing a RF output having a first and second band and representative of its first input; f) a coupler connected to the RF output having the first band and providing a representative output signal thereof; g) a sampling downconverter having first and second inputs with the first input connected to the output of the coupler and the second input connected to receive at least one sampling signal consisting of at least one clock signal, the sampling downconverter providing a beat frequency output signal resulting from the mixing of the signals connected to the first and second inputs of the sampling downconverter. The digitally tuned synthesizer further comprises; h) a frequency measurement circuit connected to the output of the sampling downconverter and providing an output representative thereof; i) a first adder having plus (+) and minus (−) inputs, the plus (+) input being connected to said fine control word, the minus (−) input being connected to the output of said frequency measuring circuit, and the first adder having an output representative of the difference between its inputs; and j) a second digital to analog converter connected to the output of the first adder and providing an output representative thereof that is connected to the second input of the combiner.

DETAILED DESCRIPTION OF THE DRAWINGS

A better understanding of the present invention may be realized by considering the following details and description, taken in conjunction with the accompanying drawings wherein:

FIG. 10 illustrates a plot resulted from the practice of the present invention that measured a phase noise at a 3.1 GHz operative frequency of the circuit of FIG. 1;

FIG. 12 illustrates the result of the practice of the present invention of showing the measurements of the absolute RF frequency acquisition of the synthesizer of FIG. 1.

DETAILED DESCRIPTION OF THE PREFERRED EMBODIMENTS

Figure 1:
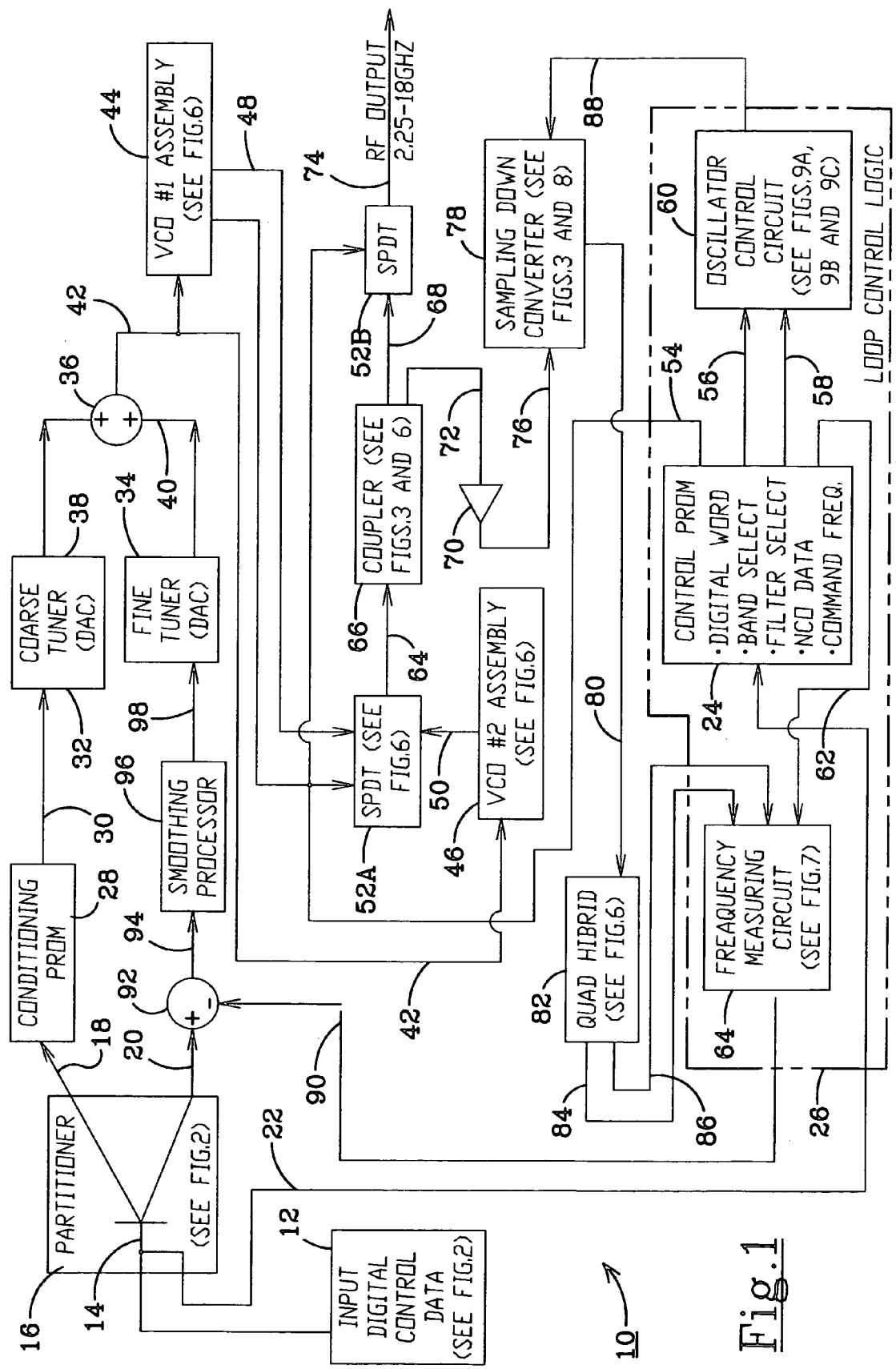
FIG. 1 is a block diagram of the RF synthesizer of the present invention.

With reference to the drawing, wherein the same reference numbers indicate the same elements throughout, there is shown in FIG. 1, a block diagram of a digitally tuned, frequency-locked radio frequency (RF) synthesizer 10. The RF synthesizer 10 includes a register 12 for receiving a digital word 14 having a predetermined number of bits. The register 12 is interconnected to a partitioner 16, which segments a predetermined number of bits of a digital word 14 into coarse and fine control words 18 and 20, respectively. The digital word 14 is also routed, via signal path 22, to a control PROM 24, which is part of loop control logic 26 shown in phantom.

The coarse controller 18 is preferably routed to a conditioning Programmable Read-Only Memory (PROM) 28. The PROM 28 has routines, known in the art, for conditioning the coarse control word 18, so as to correct for temperature and frequency variation included therein. The conditioning PROM 28 generates an output signal on signal path 30 that is routed to a coarse tuner 32 primarily consisting of a digital-to-analog converter. The coarse tuner 32, as well as the fine tuner 34, also primarily consisting of a digital-to-analog converter, may be interchangeably referred to herein as simply a digital-to-analog converter. The coarse tuner 32 provides an output signal representative of the coarse control word 18 that is routed to the positive (+) input of a combiner 36 by way of signal path 38. The combiner 36 has a second positive (+) input that receives the output of the fine tuner 34 by way of signal path 40. The output of the combiner 36, representative of the sum of the signals received on its first and second inputs, is routed, via signal path 42, to at least one voltage controlled oscillator assembly, but preferably two voltage controlled oscillator assemblies (#1 and #2) identified in FIG. 1, respectively with reference numbers 44 and 46. The voltage controlled oscillator (VCO) #1 assembly 44 and the voltage controlled oscillator (VCO) #2 assembly 46 continuously operate.

Figure 6:
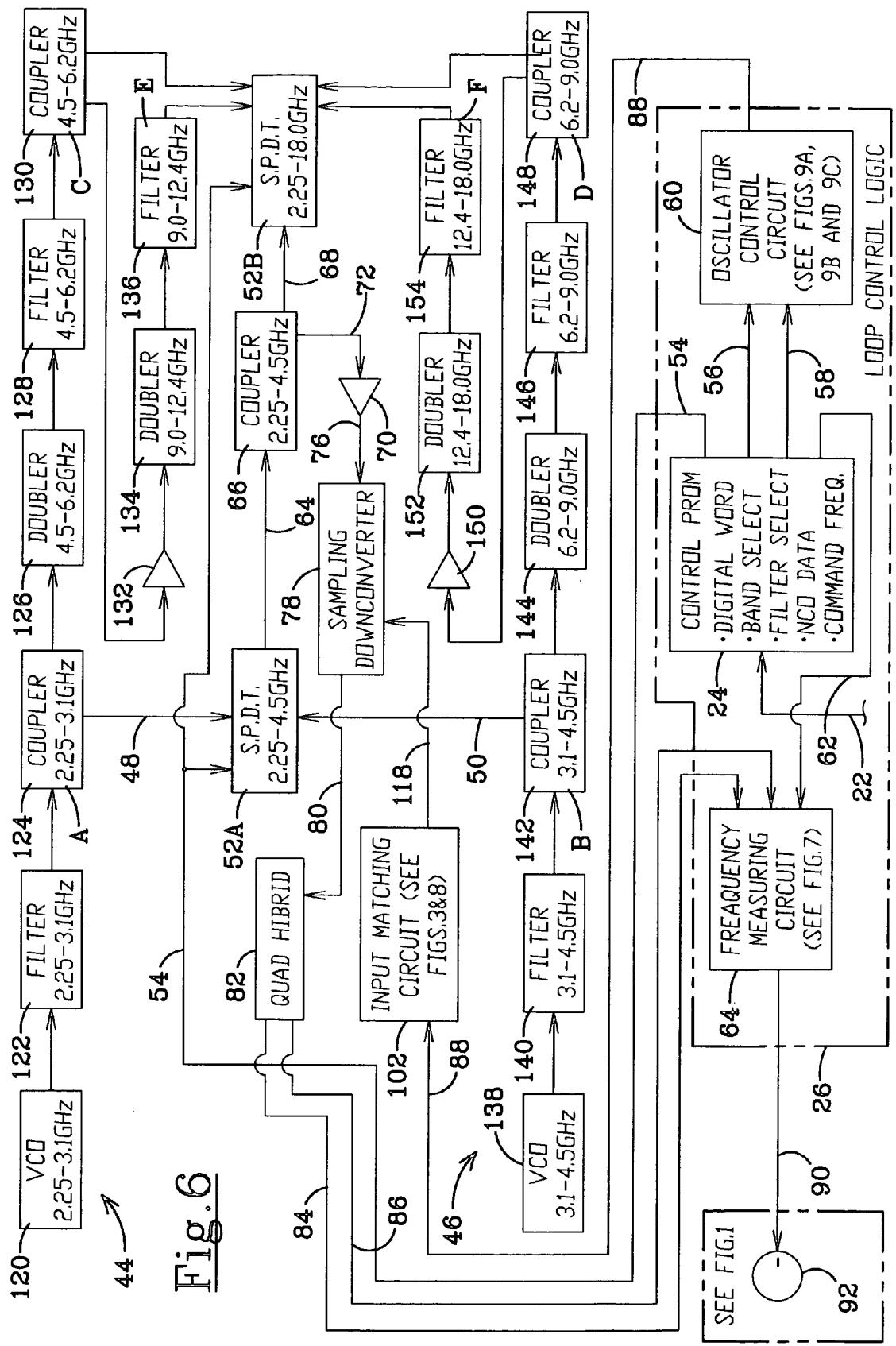
FIG. 6 is a schematic showing further details of the voltage controlled oscillators of FIG. 1.

The VCO #1 and VCO #2 assemblies 44 and 46 supply output signals on signal lines 48 and 50, to be further described hereinafter with reference to FIG. 6, to a Single Pole Double Throw (SPDT) device 52 comprised of SPDT devices 52A and 52B arranged as shown in FIGS. 1 and 6.

The SPDT devices 52A and 52B both receive, via signal path 54, a command signal BAND SELECT generated by control PROM 24 to be further described. The control PROM 24 also generates a command signal FILTER SELECT and digital data NCO DATA that are routed, via signal paths 56 and 58, to oscillator control circuits 60 to be further described herein with reference to FIGS. 9A, 9B and 9C. Further, the control PROM 24 generates a command signal COMMAND FREQ that is routed, via signal path 62, to the frequency measuring circuit 64 to be further described hereinafter with reference to FIG. 7.

The SPDT device 52A passes an output signal on signal path 64 that is routed to a coupler 66 which, in turn, generates an output signal on signal path 68 that is routed to SPDT device 52B. The coupler 66 also generates an output signal that is preferably routed to the amplifier 70 by way of signal path 72. The SPDT device 52B passes an output signal 74, which is an RF output signal in the frequency range of 2.25–18 GHz. The output signal of amplifier 70 is routed, via signal path 76, to a sampling downconverter 78, to be further described with reference to FIGS. 3 and 8.

The sampling downconverter 78 provides a beat frequency output signal, serving as an Intermediate Frequency (IF) signal, on signal path 80, which is routed to a quad-hybrid circuit 82 which, in turn, generates in-phase and quadrature components, which are to be further described with reference to FIG. 6, that are respectively applied on signal paths 84 and 86 routed to the measuring circuit 64. As previously mentioned, the measuring circuit 64 also receives a command frequency signal on signal path 62 generated by the control PROM 24. The frequency measuring circuit 64 provides an output representative of the frequency output of the sampling downconverter 78. In one embodiment, the sampling downconverter 78 is also supplied, via signal path 88, with at least one sampling pulse to correct for a limitation in the sampling downconverter 78, to be further described hereinafter with reference to FIG. 8. The at least one sampling pulse as generated by the oscillator control circuits 60 which is part of the loop control logic 26. The output signal of the measuring circuit 64 is routed, via signal path 90, to a first adder 92.

The first adder 92 has plus (+) and minus (−) inputs, the plus input being connected to the fine control word 20 and the minus (−) input being connected to the output of the frequency measuring circuit 64. The first adder 92 provides an output signal on signal path 94 that is representative of the difference of the signals present between its plus (+) and minus (−) inputs and which is preferably routed to a processor 96.

The processor 96 has routines, known in the art, that smooths, reduces or even eliminates the irregularities sometimes present in the output signal of the first adder 92. The processor 96 generates an output signal that is routed to the fine tuner 34 by way of signal path 98.

In general, the RF synthesizer 10 is digitally tuned and is locked at the frequency measured by circuit 64. The RF synthesizer 10 utilizes dual voltage controlled oscillators 44 and 46, each operator over less than an octave of incoming signal represented by the contents of the digital word 14. The dual voltage controlled oscillators 44 and 46 are cooperative operated in combination with microwave doublers to produce a multi-octave RF output 74 having low harmonics and superior characteristics. The RF synthesizer 10 uses the sampling downconverter 78 to produce an ambiguous (corrected by the present invention) wideband output that is translated from the voltage control oscillator assemblies 44 and 46. Further, the RF synthesizer 10 uses I and Q digitized quantities and an Arc Tan PROM that generates a series of digital data. The RF synthesizer 10 further measures and compares adjacent phase measurements to estimate and ambiguous VCO frequency. The digitally tuned synthesizer 10 also provides two different filters that are arranged to receive signals, a temperature compensated crystal oscillator and/or a numerically controlled oscillator, to correct for singularity problems commonly occurring for the sampling downconverters. The fine control word 20, as well as the input digital control data 14 and the coarse control word 18 each providing a predetermined control function of the RF synthesizer of FIG. 1 may all be further described with reference to FIG. 2.

Figure 2:
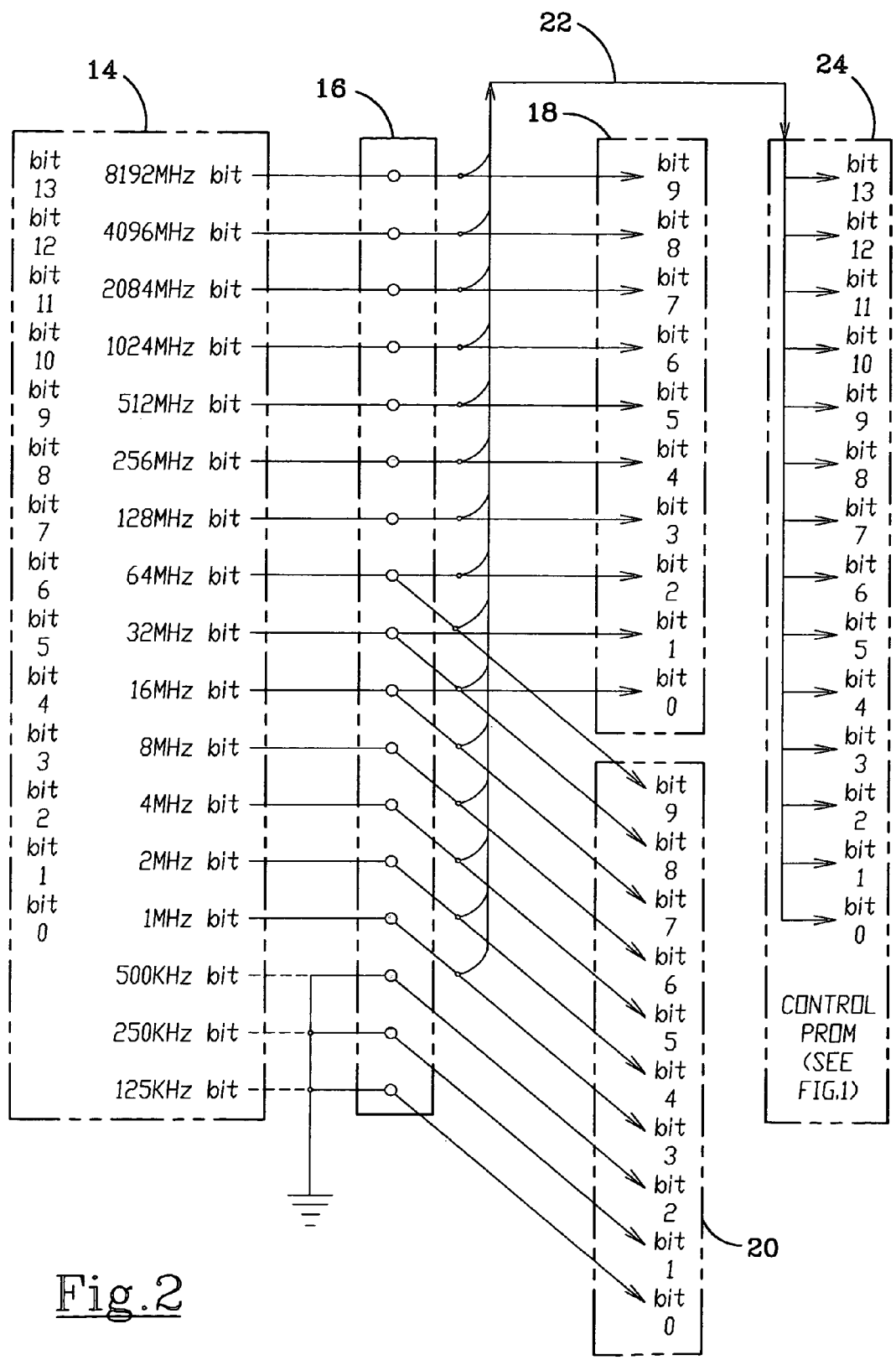
FIG. 2 illustrates a typical format of the digital words including the input data received by the RF synthesizer and the coarse and fine control words utilized by the RF synthesizer.

FIG. 2 illustrates the input control data 14, after receipt by the partitioner 16, being. routed to the control PROM 24 by way of signal path 22. FIG. 2 also shows routing by the partitioner 16 of the coarse tuning control word 18, and the fine tuning control word 20. For the embodiment shown in FIG. 2, a 14-bit digital control word is used for the input control word 14 providing a 16,384 MHz unambiguous coverage with a 1 MHz resolution. These 14 bits of digital information covers a range of 2.25 GHz to 18 GHz of RF signals generated by the VCO #1 and VCO #2 assemblies 44 and 46, to be further described with reference to FIG. 6.

The partitioning or segmenting the input control data 14 into the coarse tuning control word 18 and the fine tuning control word 20 is accomplished by the partitioner 16, which may simply be a terminal board with the appropriate wiring to provide interconnections between the input control data 14, the coarse tuning control word 18 and the fine tuning control word 20. The means for receiving the input control word 14 may simply be the register 12. The ten most significant bits (MSB) of the input control word 14 are provided for tuning the coarse tuner 32 with 16 MHz resolution. These ten most significant bits make up the coarse control word 18. The four least significant bits (LSB) of the 14-bits make up the coarse control word 18. The four least significant bits (LSB) of the 14-bit control input 14 have three "zero" bits appended, which is accomplished by way of the ground connection shown in FIG. 2. The ten least significant bits of the input control data 14 make up the fine control word 20. The ten most significant bits (MSB) of the coarse control word 18 are used to open loop coarse tune the VCO #1 and #2 assemblies 44 and 46 into a narrow frequency range (typically ±16 MHz). The ten LSB of the fine control word 20 are provided as a reference to compare to the measured RF frequency data yielded by the measuring circuit 90 of FIG. 1. Since the input digital control 14 is a 14-bit data word, providing the ten MSB for coarse tuning and the ten LSB for fine tuning provides six control bits shared by both coarse and fine tuning; these shared control bits resolve the ambiguity, to be further described hereinafter, in the measured frequency data provided by measuring circuit 64, which is controlled by control PROM 24.

The control PROM 24 is programmed to have lookup tables with stored values. The control PROM 24 examines the input data word 14 to generate the command BAND SELECT command signal which is routed to the SPDT device 52, more particularly, SPDT devices 52A and 52B by way of signal path 54. The BAND SELECT command signal is recognized by the SPDT devices 52A and 52B so that the RF output signal 74 of the digital RF synthesizer 10 is segmented into bands, preferably six A, B, C, D, E and F, to be further described hereinafter with reference to FIG. 6.

Figure 7:
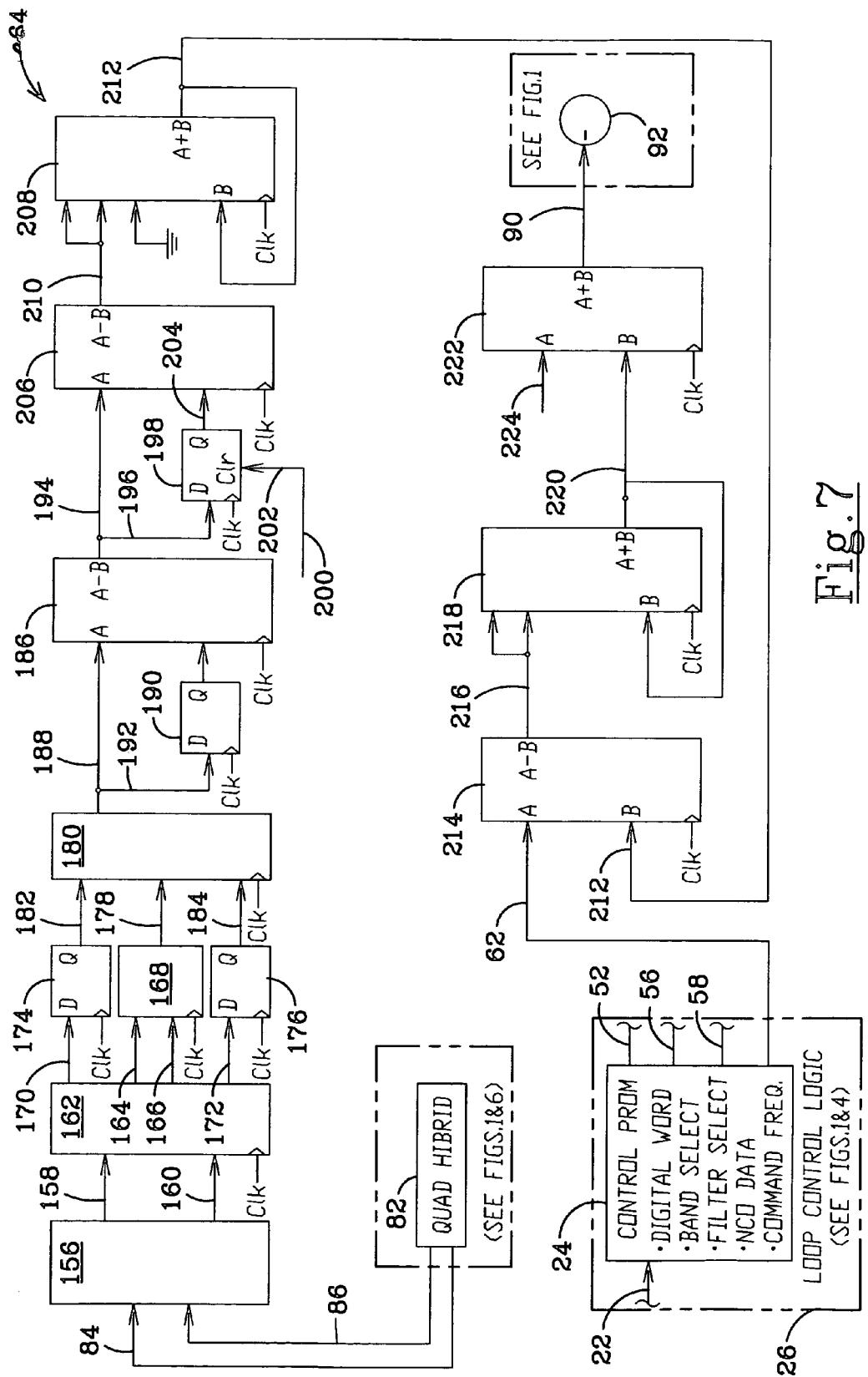
FIG. 7 illustrates details of the frequency measuring circuits shown in FIG. 1.

The control PROM 24 further examines the input data word 14 to generate the signal COMMAND FREQ which is routed to the frequency measuring circuit 64 by way of signal path 62 and provides a phase reference for the measuring circuit 64 in a manner to be further described with reference to FIG. 7.

In operation, with regard to the VCO #1 and VCO #2 assemblies 44 and 46, the input data word 14 is partitioned into coarse 18 and fine 20 control words. The coarse control word 18 is preferably corrected for temperature and frequency variation by the conditioning PROM 28, providing a digital output on signal path 30. The corrected coarse frequency data is provided to coarse tuner 32, producing a coarse tuning voltage for both the VCO #1 assembly 44 and VCO #2 assembly 46. The RF frequency of the output signal 74 is approximately linearly related to the control voltage generated by coarse tuner 32 and present on signal path 38.

The coarse tuning voltage on signal path 38 is combined, via combiner 36, with the fine tuning voltage present on signal path 40, to produce the combined VCO voltage control on signal path 42. The VCO #1 assembly 44 and VCO #2 assembly 46 provide both operating continuously, via signal path 68, a signal (2.25 to 4.5 GHz) to coupler 66 which, in turn, provides an output to the sampling downconverter 78 by way of signal path 72, preferably amplifier 70 and signal path 76.

The sampling downconverter circuit 78 translates the microwave band (2.25 to 4.5 GHz) output signal of the VCO #1 assembly 44 and VCO #2 assembly 46 to a narrow band IF signal at its output 80 ambiguously. The ambiguity caused by the translation of the microwave band of VCO #1 assembly 44 and VCO #2 assembly 46 to a narrow band IF is resolved by coarse tuning of the selected VCO #1 assembly 44 and VCO #2 assembly 46 within a narrow frequency band. The sampling downconverter circuit 78 output narrow band IF at its output 80 is provided to the digital frequency measurement circuit 64. The digital output of the frequency measurement circuit 64 on signal path 90 is compared to the fine control word 20, the difference between the measured frequency data and the input digital control data is smoothed by the processor 96, and the corrected output is provided as the digital control to the fine tuner 34. The fine tuner 34 output on signal path 40 is added by combiner 30 to the coarse tuner output on signal path 38, providing the combined control signal present on signal path 42, closing the loop controlling the VCO #1 and VCO #2 assemblies 44 and 46 and also holding the IF signal produced by the sampling downconverter 78 to a narrow band.

Figure 3:
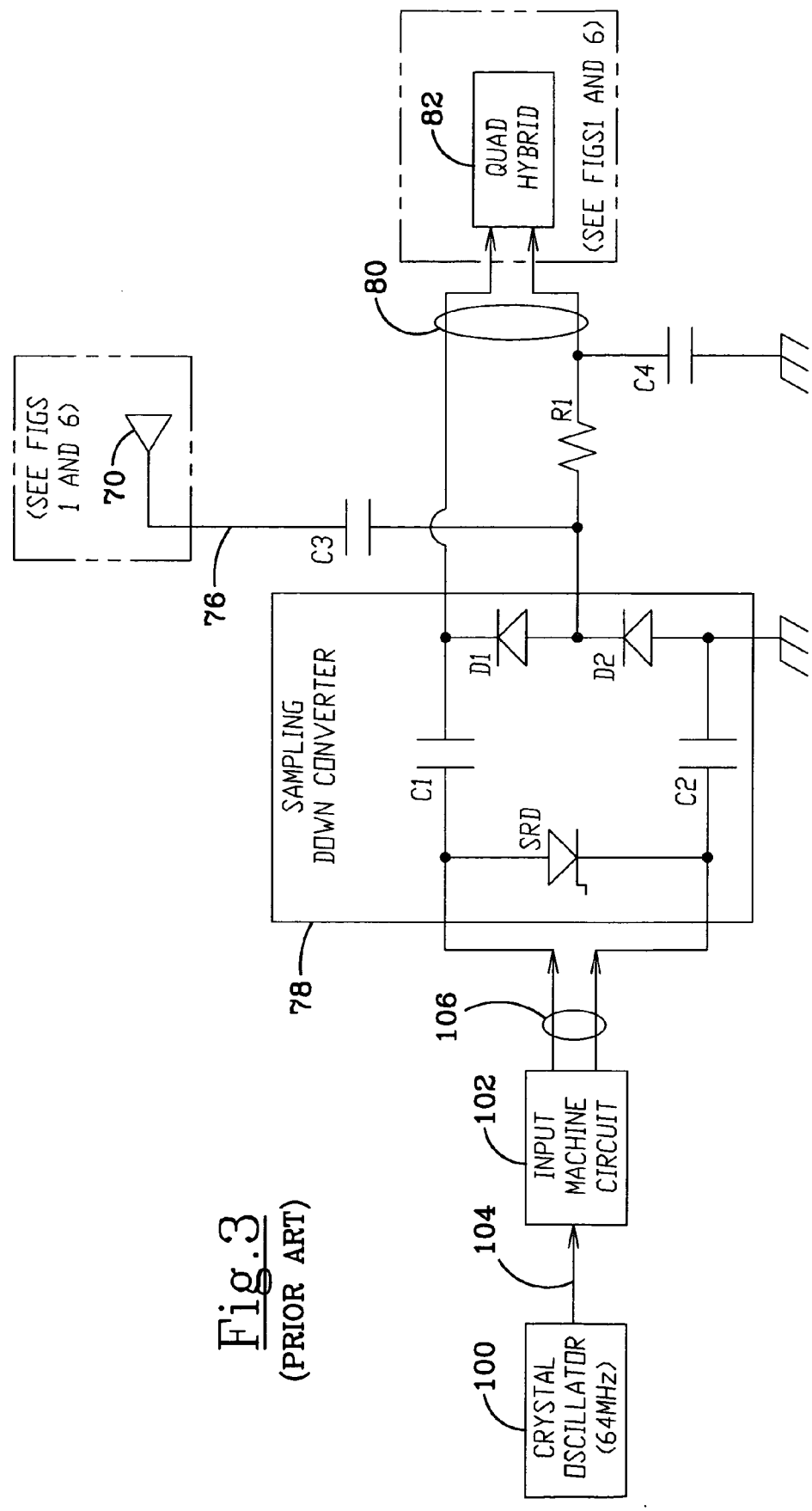
FIG. 3 illustrates a prior art sampling downconverter circuit.

The sampling downconverter circuit 78, commercially available, is shown in further detail in FIG. 3 illustrating a prior art arrangement thereof. As seen in FIG. 3, a 64 MHz crystal oscillator 100, preferably connected to an input matching circuit 102, via signal path 104 drives, via signal path 106, a Step Recovery Diode (SRD) with a sine wave. The SRD output is a half sine wave followed by an abrupt (typically 50 picosecond) impulse. This impulse is coupled through the two capacitors, C1 and C2, (each typically 0.5 pf) to the balanced pair of Schottky diodes D1 and D2. The short (50 picosecond) pulse flows through both diodes D1 and D2. The microwave signal (2.25–4.5 GHz) generated by VCO #1 assembly 44 and VCO #2 assembly 46 present on signal path 76 is introduced, via a DC blocking capacitor C3 known in the art, at the junction of the two Schottky diodes D1 and D2. If the microwave signal on signal path 76 is zero at the time of the sampling pulse generated by crystal oscillator 100, the diodes remain balanced. A microwave signal input on signal path 76 that is not zero at the time of the sampling by the crystal oscillator 100, will cause the diodes D1 and D2 to be unbalanced for the duration of the sample pulse. This low frequency diode unbalance is filtered as the "Beat" output frequency resulting from the mixing of the microwave signal on signal path 76 and the clock frequency on signal path 106. The circuit arrangement of FIG. 3 suffers drawbacks to be furthered discussed, which are corrected by the circuit arrangement of FIG. 8 also to be discussed hereinafter.

The operation of the sampling downconverter 78 may be better understood by first discussing the mathematical basis of the sampling downconverter 78.

Consider a train of uniform pulses $U(\tau,t)$, with unit height, duration $\tau$, occurring at rate $\omega_s$. The Fourier series representation of this waveform is:

$$U(\tau, t) = \sum_{n=-\infty}^{\infty} C_n \varepsilon^{jn\omega_s t} \quad (1)$$

where $C_n$ denotes the Fourier coefficients and is given by:

$$C_n = \frac{1}{T} \int_0^T U(\tau, t) \varepsilon^{-jn\omega_3 t} dt \quad (2)$$

and T is the period of $U(\tau,t)$.

By definition $U(\tau,t)=1$ for $kT \leq t \leq kT+\tau$, and is 0 elsewhere, for all integer k.

Therefore, equation (2) reduces to:

$$C_n = \frac{1}{T} \int_0^\tau \varepsilon^{-jn\omega_s t} dt \quad (3)$$

Carrying out the integration shown for equation (2) produces:

$$C_n = \frac{1 - \varepsilon^{-jn\omega_3 t}}{jn\omega_s T} \quad (4)$$

For n=0, we see:

$$C_0 = \frac{\tau}{T} \quad (5)$$

Inserting equation (4) into equation (1) produces:

$$U(\tau, t) = \sum_{n=-\infty}^{\infty} \frac{1 - \varepsilon^{-jn\omega_s \tau}}{jn\omega_s T} \varepsilon^{jn\omega_s t} \quad (6)$$

Rearranging produces the frequency domain expression for the unit sampling function $U(\tau,t)$:

$$U(\tau, t) = \frac{\tau}{T} + \sum_{n=1}^{\infty} \frac{\sin(n\pi\tau/T)}{n\pi\tau/T} \cos n(\omega_s t - \phi) \quad (7)$$

where:

$$\omega_S = \frac{2\pi}{T} \quad \text{and} \quad \phi = \frac{\omega_S \tau}{2}$$

Figure 4:
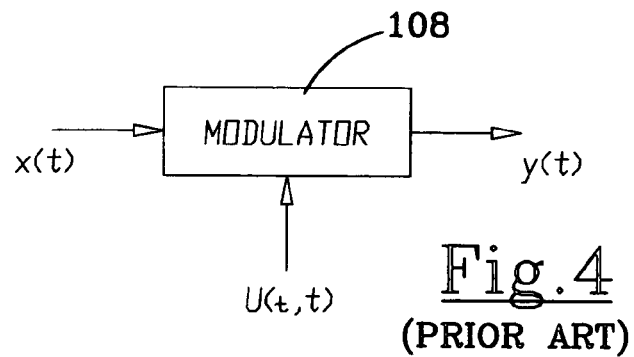
FIG. 4 is a block diagram of prior art modulation associated with the operation of the sampling downconverter.

Using the sampling function, and with reference to FIG. 4 showing a modulator 108, as to modulate an RF input, x(t), produces an RF output, y(t):

The output y(t) of FIG. 4, can be expressed in terms of the input, x(t), and the sampling function, $U(\tau,t)$ as the product:

$$Y(t) = \frac{\tau}{T} x(t) + \frac{2\tau}{T} \sum_{n=1}^{\infty} \frac{\sin(n\pi\tau/T)}{n\pi\tau/T} x(t) \cos n(\omega_s t - \phi) \quad (8)$$

The input signal, x(t), of FIG. 4 is represented as:

$$x(t) = V \cos(\omega_0 t + \theta_0) \quad (9)$$

The sampled output, y(t), of FIG. 4 is the product:

$$y(t) = \frac{\tau V}{T} \cos(\omega_0 t + \theta_0) + \frac{2\tau V}{T} \sum_{n=1}^{\infty} \frac{\sin(n\pi\tau/T)}{n\pi\tau/T} \quad (10)$$
$$\cos(\omega_0 t + \theta_0) \cos n(\omega_s t - \phi)$$

Rearranging the terms of equation (10) yields:

$$y(t) = \frac{\tau V}{T}\cos(\omega_0 t + \theta_0) + \frac{\tau V}{T}\sum_{n=1}^{\infty}\frac{\sin(n\pi\tau/T)}{n\pi\tau/T} \quad (11)$$
$$\cos[(\omega_0 + n\omega_S)t + \theta_0 + n\phi] +$$
$$\frac{\tau V}{T}\sum_{n=1}^{\infty}\frac{\sin(n\pi\tau/T)}{n\pi\tau/T}\cos[(\omega_0 - n\omega_S)t + \theta_0 + n\phi]$$

The application of a sampling downconverter to a frequency locked synthesizer, such as the synthesizer 10 of FIG. 1, requires conversion of microwave frequencies to a low frequency baseband by sampling a microwave signal using a relatively low frequency clock. The operative cooperation causes sampling downconverter, such as sampling downconverter 78, to yield an IF signal. If the microwave input frequency, $\omega_0$, is sampled at the clock frequency, $\omega_s$, then the sampled output frequency of interest, $y_s(t)$, is described by that part of equation (11), as:

$$y_s(t) = \frac{\tau}{T}\frac{\sin(n\pi\tau/T)}{n\pi\tau/T}\cos(\omega_0 - n\omega_S)t \quad (12)$$

where V=1, and the phase terms are ignored.

Appropriate filtering, as will be described hereinafter with reference to FIG. 6, removes all terms, except the term of equation (12) that produces an output where:

$$\omega_0 - n\omega_S \leq \frac{\omega_S}{2} \quad (13)$$

This output occurs when the difference between the microwave frequency and some harmonic of the clock frequency is less than half the clock frequency. Since the definition of the Unit Sampling Function (U($\tau$,t)) asserts an infinity of clock harmonics, there will always exist a microwave frequency, $\omega_0$, that meets this criteria associated with some harmonics. The net effect is that the microwave frequency is always translated to a baseband by the operation of the sampling downconverter, such as sampling downconverter 78.

Examination of equation (12) for typical circuit characteristics indicates that this frequency translation process is associated with substantial losses. There are two parts of this loss. The first part represents the energy loss just due to sampling, and is represented by the term $$\frac{\tau}{T},$$

merely asserting that the smaller the width of the sampling aperture, $\tau$, relative to the period of the sampling clock, T, the smaller the available output energy. The second part of the sampling loss is dependent on the ratio of the sample gate width, $\tau$, to the period of the sampled microwave signal, and is represented by the term $$\frac{\sin(n\pi\tau/T)}{n\pi\tau/T}.$$

The frequency dependent aspect of this term may be understood by considering that, if the sample gate width, $\tau$, were equal to a full period of the microwave input signal, $\omega_0$, then the sample gate output is necessarily zero. The losses typically associated with a sampling downconverter may be further discussed with reference to FIG. 5.

Figure 5:
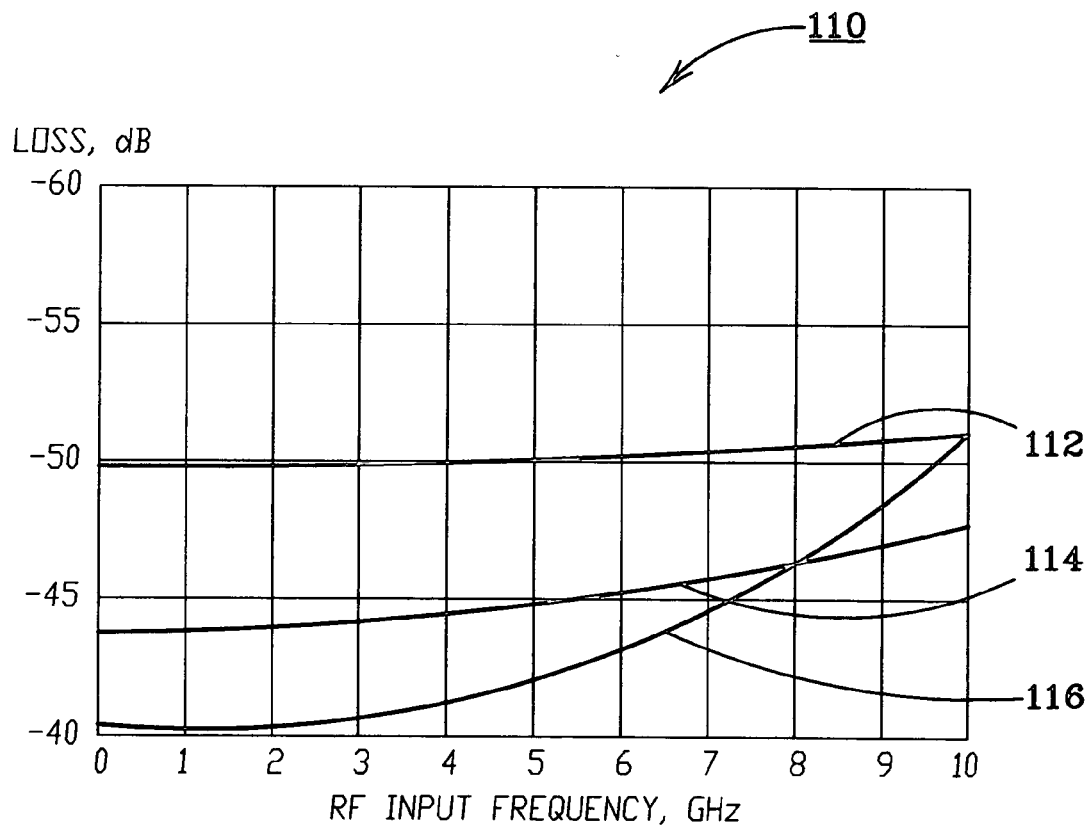
FIG. 5 illustrates plots showing typical losses associated with microwave downconverter systems.

FIG. 5 illustrates a family 110 of plots 112, 114 and 116 showing the loss, in dB, of a prior art microwave sampling downconverter system employing a 64 MHz clock, converting microwave signals up to 10 GHz, with sample pulses having gate widths, t, of 50 pS (plot 112), 100 pS (plot 114), and 150 pS (plot 116).

From FIG. 5, it should be noted for shorter sample gate widths, t, the system can accommodate higher microwave frequencies, but with larger conversion losses. The wider sample gate width, t, produces the lowest losses at the lower microwave frequencies having the parameters previously discussed with reference to equations (1) to (12).

An examination of equations (1) to (12) reveals an essential conclusion which is, if the VCO frequency is $\omega_0$ and the sample clock frequency is $\omega_s$, then the sampling downconverter IF output frequency, $\omega_{IF}$, of the sampling downconverter 78 may be expressed as:

$$\omega_{IF} = \omega_0 - n\omega_s, \text{ for } n=1,2,3 \quad (14)$$

Since the harmonics of the clock ($n\omega_s$) are spaced at clock frequency intervals, the maximum possible difference between the frequency of the output signal 74 generated by VCO #1 assembly 44 and VCO #2 assembly 46, and the closest multiple of the clock frequency is half the clock frequency; in other words, since:

$$(n-1)\omega_s \leq \omega_0 \leq n\omega \quad (15)$$

then:

$$\frac{-\omega_s}{2} \leq \omega_{IF} \leq \frac{+\omega_s}{2} \quad (16)$$

Using the typical 64 MHz clock frequency, then, irrespective of the VCO frequency, the IF frequency at the sampling downconverter 78 output on signal paths 80 and 82 has to be in the range of −32 MHz to +32 MHz. The accuracy of the open loop coarse tuning of VCO #1 assembly 44 and VCO #2 assembly 46 (currently ±16 MHz) assures that there is no ambiguity in the frequency measurement in a manner to be further described hereinafter. The generation of the RF output 74 of the digital synthesizer 10 of FIG. 1 may be further described with reference to FIG. 6.

FIG. 6 illustrates that VCO #1 assembly 44 is comprised of elements given on Table 1 and that VCO #2 assembly 46 is comprised of elements given in Table 2.

TABLE 1

| Element | Function | Range |
|---------|----------|-------|
| 120 | VCO | 2.25–3.1 GHz |
| 122 | Filter | 2.25–3.1 GHz |
| 124 | Coupler | 2.25–3.1 GHz |
| 126 | Doubler | 4.5–6.2 GHz |

TABLE 1-continued

| Element | Function | Range |
|---------|----------|-------|
| 128 | Filter | 4.5–6.2 GHz |
| 130 | Coupler | 4.5–6.2 GHz |
| 132 | Amplifier | |
| 134 | Doubler | 9.0–12.4 GHz |
| 136 | Filter | 9.0–12.4 GHz |

TABLE 2

| Element | Function | Range |
|---------|----------|-------|
| 138 | VCO | 3.1–4.5 GHz |
| 140 | Filter | 3.1–4.5 GHz |
| 142 | Coupler | 3.1–4.5 GHz |
| 144 | Doubler | 6.2–9.0 GHz |
| 146 | Filter | 6.2–9.0 GHz |
| 148 | Coupler | 6.2–9.0 GHz |
| 150 | Amplifier | |
| 152 | Doubler | 12.4–18.0 GHz |
| 154 | Filter | 12.4–18.0 GHz |

FIG. 6 also identified different elements with the letters A, B, C, D, E and F representative of different RF Sub-band each having a segmented frequency band all of which is shown in Table 3.

TABLE 3

| RF Sub-band | Frequency, GHz | Element Output |
|-------------|----------------|----------------|
| A | 2.25–3.1 | 124 |
| B | 3.1–4.5 | 142 |
| C | 4.5–6.2 | 130 |
| D | 6.2–9.0 | 148 |
| E | 9.0–12.4 | 136 |
| F | 12.4–18.0 | 154 |

Each of these sub-bands A, B, C, D, E and F is less than one octave in width; this allows simple filtering to suppress harmonic spurious outputs. Further, limiting the VCO frequency coverage provided by VCO #1 assembly 44 and VCO #2 assembly 46 to substantially less than one octave eases the task of linearization of the VCO control of VCO #1 and VCO #2 assemblies 44 and 46, as well as open loop coarse tuning of the VCO #1 and VCO #2 assemblies 44 and 46.

As seen in FIG. 6, following each VCO #1 assembly 44 and VCO #2 assembly 46 is the sequence: frequency doubler, filter, doubler, filter. The low band provided by VCO #1 assembly 44, operating over the 2.25–3.1 GHz band, doubles to 4.5–6.2 GHz, then doubles again to 9.0–12.4 GHz. Similarly, the high band provided by VCO #2 assembly 46, operates over the 3.1–4.5 GHz band, doubles to 6.2–9.0 GHz and again to 12.4–18 GHz. In this way, the entire 2.25–18 GHz output range is serviced by the two VCO assemblies 44 and 46.

With reference to FIG. 6 and Table 3, the control PROM 24 (BAND SELECT), via signal path 54, determines which Sub-band A, B, C, D, E or F of the RF synthesizer 10 operates within. For example, when the control PROM 24 receives the input data word 14 and examines it and determines that its contents is between 2.25–3.1 GHz, then the control PROM 24 will generate a BAND SELECT command word on signal path 54 that is recognized by SPDT devices 52A and 52B (appropriately programmed) so that the output of coupler 124 (Sub-band A) is passed through SPDT device 52A, coupler 66 and SPDT 52B and appears as RF output 74 of the RF synthesizer 10 of the present invention. For this example, the Sub-band A output of coupler 124 is also delivered to sampling downconverter 78 which, in turn, provides an output on signal path 80 to quad hybrid circuit 82.

The purpose of the quad hybrid circuit 82 is to provide an in-phase and quadrature signal pair to the frequency measuring circuit 64. The VCO frequency (or the multiple of the VCO frequency) selected for the system RF output generated by VCO #1 assembly 44 and VCO #2 assembly 46 is also the VCO frequency that is controlled by the loop of the digitally tuned and frequency locked RF synthesizer 10.

The VCO #1 assembly 44 and VCO #2 assembly supply the sampling downconverter 78 with an RF input signal on signal path 76. The sampling downconverter 78 then supplies a beat frequency signal, via signal path 80 to the quad hybrid 82. The output of quad hybrid circuit 82 is routed to the frequency measuring circuit 64 by way of signal paths 84 and 86, respectively, carrying in-phase and quadrature components of the IF signal comprising the beat frequency signal generated by the sampling downconverter 78. The measuring circuit 64 may be further described with reference to FIG. 7.

The in-phase and quadrature inputs on signal paths 84 and 86, respectively, are inputted into and digitized by a dual analog-to-digital converter (ADC) 156. The ADC 156 provides digitized in-phase (sine) and quadrature (cosine) components I and Q, respectively on signal paths 158 and 160 which is routed to a magnitude conversion circuit 162.

The magnitude conversion circuit 162 forms the absolute value of the sampled sine and cosine values of IF signals that are respectively applied, via signal paths 164 and 166 to an Arc Tan circuit 168. The magnitude conversion circuit 162 further supplies a one-bit function (I) on signal path 170 and a one-bit function (Q) on signal path 172 to identify the quadrant of the sine and cosine values and wherein signal paths 170 and 172 are respectively routed to circuits 174 and 176.

The Arc Tan circuit 168 forms the Arc Tan of the sine to cosine ratio, estimating the instantaneous phase of the IF signal, by using the quadrature data on signal paths 170 and 172 from the magnitude conversion circuit 162. The output of the Arc Tan circuit 168 is routed via signal path 178, to a phase circuit 180 which also receives the output of circuits 174 and 176, via signal paths 182 and 184, respectively.

The circuit 180 removes the built-in phase offset present in the output of the quad hybrid circuit 82. The output of circuit 180 is representative of the absolute output phase of the IF signal on signal paths 84 and 86 and is provided to one port (A) of a subtraction (A–B) circuit 186, via signal path 188. The absolute phase present on signal path 188 is delayed by one clock cycle by circuit 190 receiving the absolute phase on signal path 192 and providing a quantity delayed by one clock cycle to the B input of the subtraction circuit 186.

The output of the subtraction circuit 186 on signal path 194 represents the change of phase of the IF signal in one clock cycle. Since, by definition, the frequency is defined as a rate of change of phase over time, the phase step quantity present on signal path 194 is, in actuality, a rough approximation of the frequency of IF signal generated by the sampling downconverter 78. The output of the subtraction circuit 186 is also routed, via signal path 196, to a circuit 198 which is a 16 cycle delayed circuit and which also receives a tune strobe quantity 200 serving as a clear signal generated (not shown) by control PROM 24 on signal path 202. The 16 cycle delayed circuit 198 provides an output on signal path 204 that is routed to the B port of the second subtraction circuit 206 whose port A receives the output of the subtraction circuit 186 on signal path 194.

The second subtraction circuit 206 operates to remove the initial frequency data from the estimated RF signal appearing on signal paths 84 and 86 and supplies an output signal that is routed to a circuit 208 by way of signal path 210. The circuit 208 is an accumulator circuit which establishes the control loop of the circuit arrangement of FIG. 7 as a second order loop. The accumulator circuit 208 generates an output signal that is routed on signal path 212 to a subtractor circuit 214.

The signal on signal path 212 represents the accumulated rate of change of phase (IF frequency) data which is compared against a command frequency data, serving as an estimated reference known by the control PROM 24, generated by the control PROM 24 by way of COMMAND FREQ signal presented on signal path 62 that is routed to circuit 214. The difference between the signals on signal paths 212 and 62 represents an accumulated error and is routed, via signal path 216 to circuit 218.

The circuit 218 generates an output signal on signal path 220 that is routed to circuit 222. Circuit 222 receives a signal on signal path 224 generated (not shown) by control PROM 24 representative of a digital quantity 8192 which it uses to offset the accumulator error generated by circuit 222 by the digital quantity 8192 so as to match the data format of the fine control word 20. The circuit 222 generates an output on signal path 90 that is routed to the first adder 92 previously discussed with reference to FIG. 1.

There is a problem with the RF synthesizer 10 as described hereinbefore, more particularly, with the prior art arrangement of the sampling downconverter 78 shown in FIG. 3. More precisely, if the VCO #1 assembly 44 and VCO #2 assembly 46 is tuned such that the IF frequency on signal paths 84 and 86, generated by the sampling downconverter circuit 78, occurs exactly midway between two harmonics of the clock frequency ωs, there will be two inputs to the frequency measuring circuit 62, $-\omega_s/2$ and $+\omega_s/2$ previously discussed with reference to equation (16). At this singularity, the frequency measuring circuit 64 would not know in which direction to move the VCO #1 assembly 44 and VCO #2 assembly 46 in order for the selected VCO to be adjusted to the desired RF output signal 74. Second, if the VCO #1 assembly 44 and VCO #2 assembly 46 is tuned to a frequency which is an exact harmonic of the clock frequency, the output signal from the sampling downconverter 78 on signal path 80 will be a DC signal. Quad Hybrids, such as quad hybrid circuit 82, cannot process a DC input (phase quadrature at DC is not defined). These problems are cured by the practice of the present invention and may be further described with reference to FIG. 8.

Figure 8:
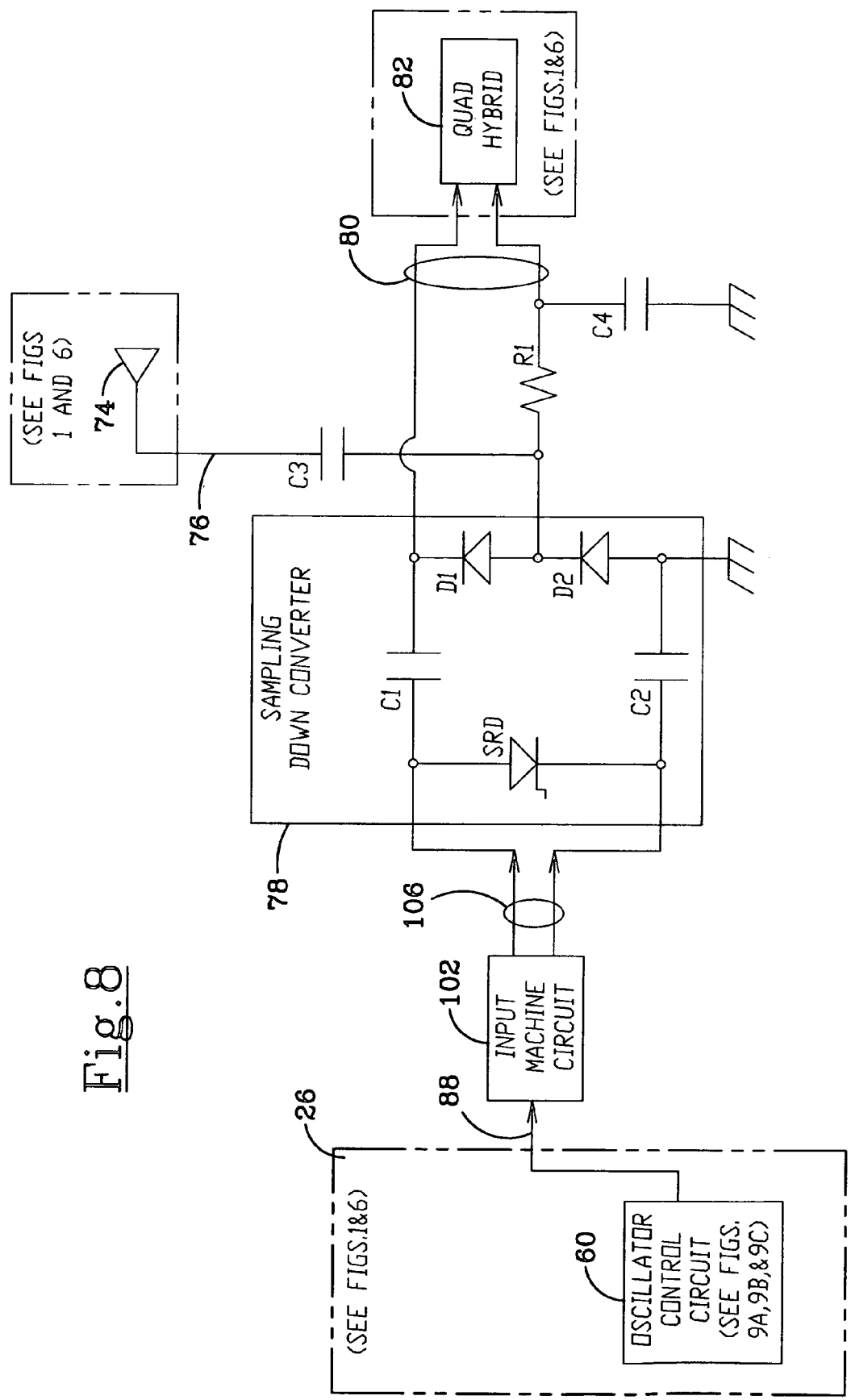
FIG. 8 is a block diagram illustrating the improvements of the present invention associated with the sampling downconverter shown in FIG. 1.
Figure 9C:
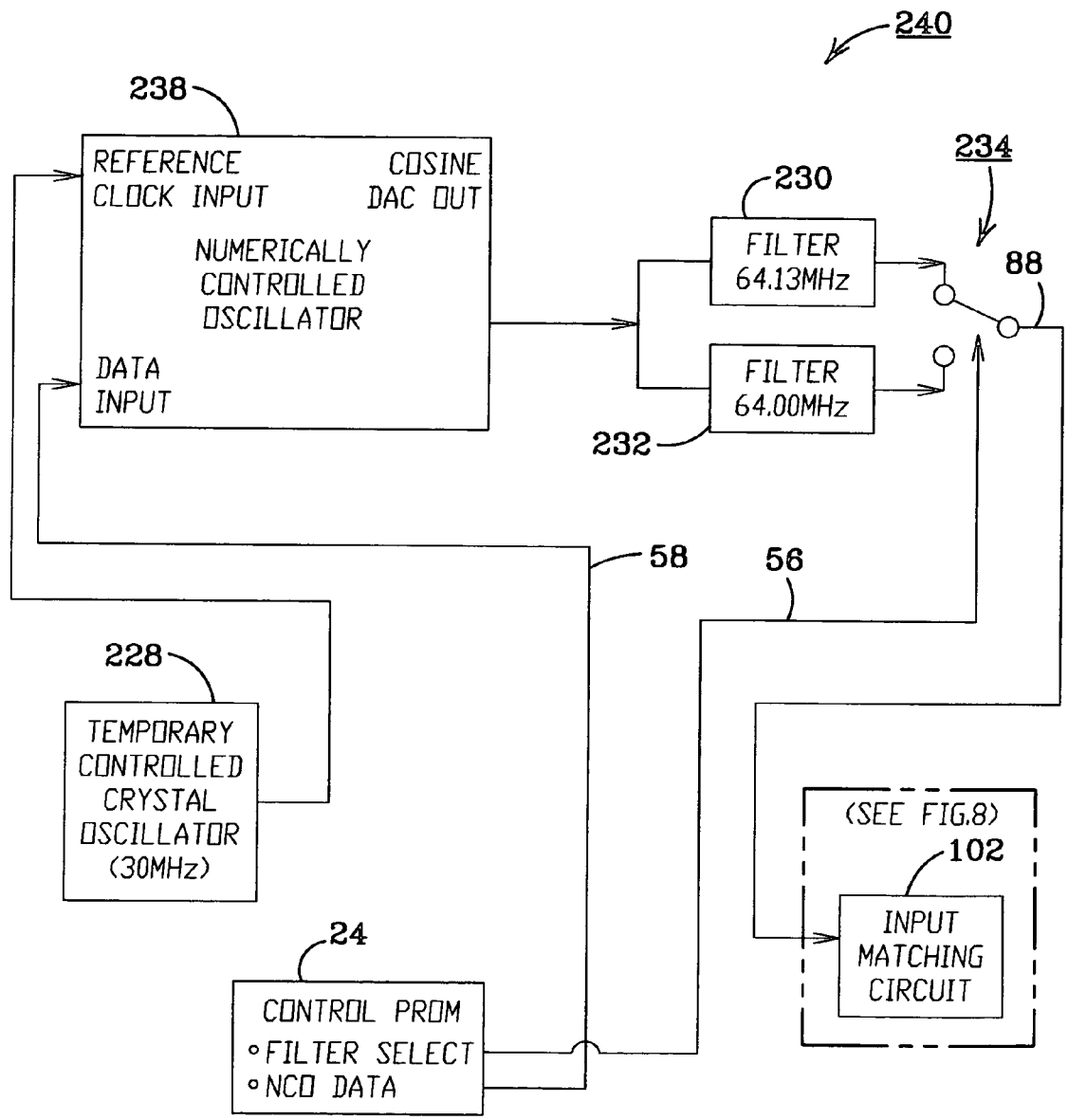
FIG. 9 is composed of FIGS. 9A, 9B and 9C which respectively illustrates a block diagram of a first embodiment of the oscillator control circuits of FIG. 1, a block diagram of a second embodiment of the oscillator control circuits of FIG. 1, and an arrangement that provides for either or both of the embodiments of FIGS. 9A and 9B.

The arrangement of FIG. 8 is quite similar to the arrangement of FIG. 3 with the exception that the crystal oscillator 100 of FIG. 3 has been replaced by the oscillator control circuit 60 of the present invention that may be further with reference to FIG. 9 composed of FIGS. 9A, 9B and 9C.

FIG. 9A is a block diagram of a first embodiment 226 of the oscillator control circuit 60 arranged as shown and comprised of a temperature controlled crystal oscillator 228, preferably having an output frequency of 30 MHz and which may be of a conventional type. The embodiment 226 further comprises a filter 230 which may be selected for a frequency of 64.13 Mhz, a filter 232 which may be selected for a frequency of 64.00 Mhz, and an electronic switch 234 which is responsive to the FILTER SELECT function generated by the control PROM 24 and present on signal path 56.

In operation, the control PROM 24, in response to an appropriate routine running in the control PROM 24, generates the FILTER SELECT function causing the 30 MHz output signal of the temperature controlled crystal oscillator 228 filtered by filter 232 to appear as the input 88 to the input matching circuit 102. If the FILTER SELECT function is not generated, the 30 MHz output signal of the temperature controlled crystal oscillator 228 filtered by filter 230 appears as the input 88 to the input matching circuit 102.

FIG. 9B is a block diagram of another embodiment 238 of the oscillator control circuit 60 arranged as shown. The embodiment 238 of FIG. 9B is similar to the embodiment 236 of FIG. 9A except that the temperature controlled crystal oscillator 228 is replaced by a numerically controlled oscillator 238 which may be of the type AD9954 made available from the provider Analog Devices. The numerically controlled oscillator preferably provides an output frequency of 30 MHz in response to the digital data comprising the NCO DATA generated by control PROM 24 and made available on path 58. The embodiment 236 operates in a manner similar to embodiment 226 in response to the FILTER SELECT function generated by the control PROM 24 and made available on signal path 58.

FIG. 9C illustrates an arrangement 240 that accommodates either or both of the embodiments 226 and 236 of FIGS. 9A and 9B. More particularly, if the embodiment 226 of FIG. 9A is to be practiced, then the control PROM 24 does not supply any data for NCO DATA that is routed to the DATA INPUT of numerically controlled oscillator 238 by way of path 58; thereby causing the numerically controlled oscillator 238 to receive at its input (REFERENCE CLOCK INPUT) the 30 MHz output from the temperature controlled crystal oscillator 228. This received 30 MHz output is passed to both the filters 230 and 232 by way of the output (COSINE DAC OUT) of the numerically controlled oscillator 238. Conversely, if the embodiment 226 of FIG. 9B is to be practiced, the control PROM 24 supplies data for the NCO DATA that is routed to the DATA INPUT of the numerically controlled oscillator 238 so that the numerically controlled oscillator 238 generates a 30 MHz output signal that is supplied to the filters 230 and 232.

For both embodiments 226 (FIG. 9A) and 236 (FIG. 9B), the selective filtering (64.13 MHz or 64.00 MHz) is designed to provide a slight shift in the clock harmonics to avoid both of the two singularity problems related to downconverters previously discussed with reference to FIG. 8. This selective filtering places the IF outputs of the sampling downconverter 78 from a 2.25 GHz to 4.5 GHz inputs thereto into a band from 5 MHz to 27 MHz thereby, avoiding both the processing problem associated with clock harmonic frequencies and processing the half clock frequency previously discussed with reference to FIG. 8.

Figure 11:
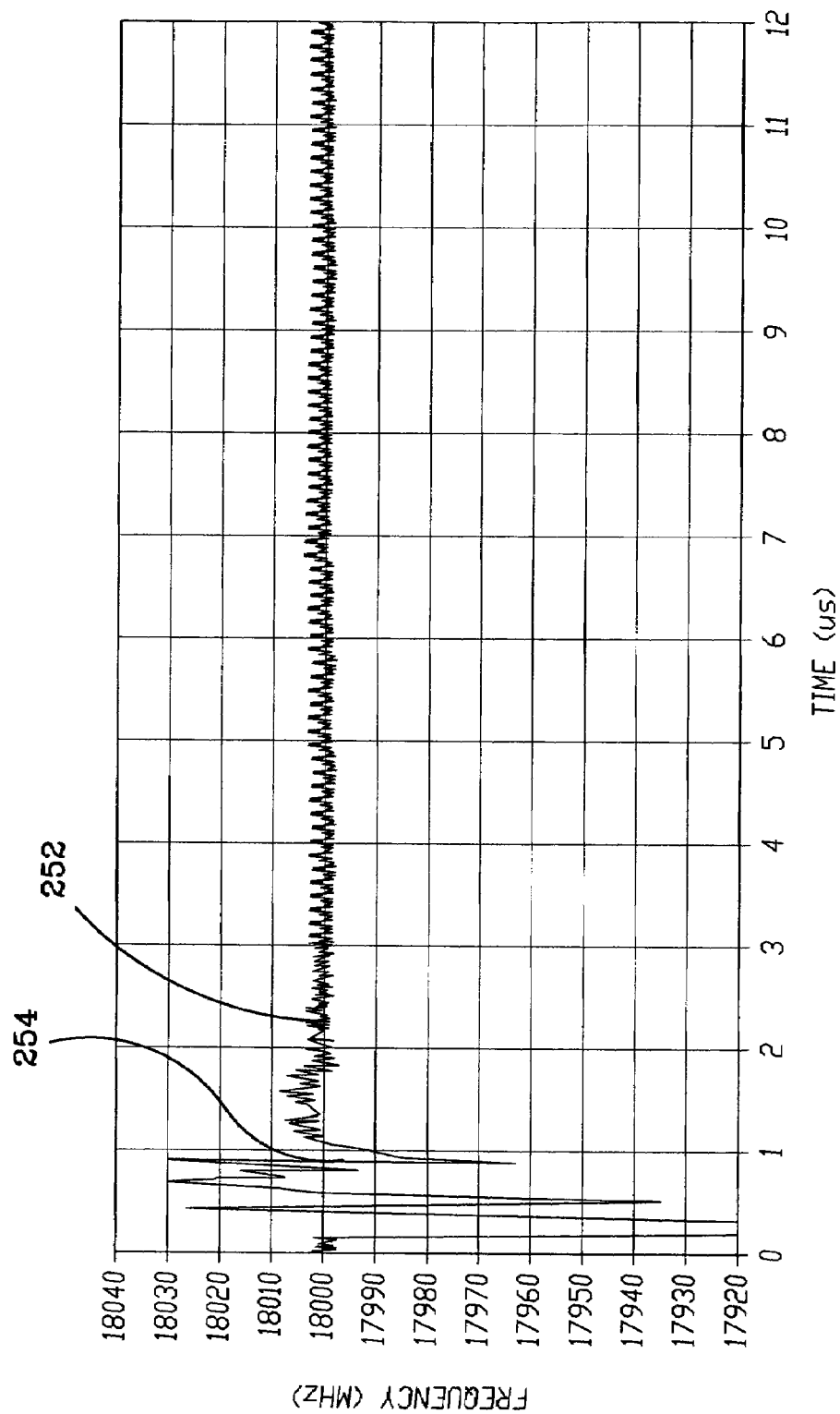
FIG. 11 illustrates the result of the practice of the present invention for the measurements associated with the acquisition time of the synthesizer of FIG. 1.

In the practice of the present invention, the frequency locked digitally tuned oscillator (FT/DTO) circuit serving as the RF synthesizer 10 has been implemented, with test results summarized in FIGS. 10, 11, and 12.

FIG. 10 illustrates a family 242 of plots 244 and 246 of the measured Phase Noise (plot 244) at a 3.1 GHz output frequency (plot 246). The measured result of −72.69 dBc/Hz (identified by reference number 248) at 100 Hz offset (identified by reference number 250) is competitive with commercial phase locked synthesizers having the disadvantages discussed in the "Background" section.

FIG. 11 illustrates a plot 252 representing the measurements (using a delay line correlator) of the acquisition time of the synthesizer, for a 7 GHz (generally identified by reference number 254) to 18 GHz output frequency step, at less than 3 μS. This data is three to four orders of magnitude faster than a phase lock synthesizer of the prior art such as that discussed in the "Background" section.

FIG. 12 illustrates a plot 256 that represents the measurements of the absolute RF frequency accuracy of the synthesizer output.

It should now be appreciated that the practice of the present invention provides for dual VCO #1 and VCO #2 assemblies, each operating over less than an octal of an incoming RF signal, and each operating in conjunction with the combination of microwave doublers to produce a multi-RF output with low harmonics and superior characteristics.

It should be further appreciated that the practice of the present invention provides for a sampling downconverter which produces ambiguous wideband output that is translated from the VCO #1 and VCO #2 assemblies 44 and 46. The ambiguous output is corrected by the present invention by use of I and Q digitized quantities and a control PROM 24 generating a series digital phase data (COMMAND FREQ), that is then compared against adjacent phase measurements to estimate the ambiguous VCO frequency and provide for a correction thereof.

It is further appreciated that the practice of the present invention provides at least two embodiments, each of which cooperate with filtering arrangements for curing the singularity problems commonly experienced by the sampling downconverters.

Obviously, many modifications and variations of the present invention are possible in light of the foregoing teachings. It is therefore, to be understood that within the scope of the independent claims of the invention may be practiced as otherwise described.

What I claim is:

1. A digitally tuned synthesizer comprising:
    a) a register for receiving a digital word having a predetermined number of bits;
    b) a partitioner interconnected to said register for partitioning said predetermined number of bits of said digital word into coarse and fine control words;
    c) a first digital to analog converter connected to said coarse control word and providing an output representative of said coarse control word;
    d) a combiner having first and second inputs receiving signals and an output representative of the sum of the signals received on the first and second inputs, said first input connected to said output of said first digital to analog converter;
    e) at least one voltage controlled oscillator having a first input connected to said output of said combiner and providing a RF output having a first and a second band and representative of its first and second input;
    f) a coupler connected to said RF output having said first band and providing a representative output signal thereof;
    g) a sampling downconverter having first and second inputs with the first input connected to said output of said coupler and the second input connected to received at least one sampling signals consisting of at least one clock signal, said sampling downconverter providing a beat frequency output signal resulting from the mixing of the signals connected to the first and second inputs of said sampling downconverter;
    h) a frequency measurement circuit connected to the output of said sampling downconverter and providing an output representative thereof;
    i) a first adder having plus (+) and minus (−) inputs, said plus (+) input being connected to said fine control word, said minus (−) input being connected to said output of said frequency measuring circuit, said first adder having an output representative of the difference between its inputs; and
    j) a second digital to analog converter connected to said output of said first adder and providing an output representative thereof that is connected to said second input of said combiner.

2. The digitally tuned synthesizer according to claim 1 further comprising a first Programmable Read-Only Memory (PROM) interposed between said partitioner and said first digital to analog converter and receiving said coarse control word, said PROM having routines for conditioning said coarse control word so as to correct for temperature and frequencies variations included in said coarse control word.

3. The digitally tuned synthesizer according to claim 1 further comprising a processor interposed between said output of said first adder and second digital to analog converter, said processor receiving said output of said first adder and reducing and eliminating irregularities included in the output of said first adder.

4. The digitally tuned synthesizer according to claim 1, wherein said at least one voltage controlled oscillator comprises first and second voltage controlled oscillators each having an input connected to the output of said combiner, and wherein said digitally tuned synthesizer further comprises:
    at least one selectable switch responsive to a respective band select signal; and
    a second Programmable Read-Only Memory (PROM) having an input connected to said digital word, said second PROM generating said band select signals whereby said digitally tuned synthesizer generates an output signal which is within at least one segmented band.

5. The digitally tuned synthesizer according to claim 4, wherein said first voltage controlled oscillator has a frequency band from about 2.25 GHz to about 3.2 GHz and said second voltage controlled oscillator has a frequency band from about 3.1 GHz to about 4.5 GHz.

6. The digitally tuned synthesizer according to claim 5 further comprising a series of frequency multipliers selectively connected to the outputs of said first and second voltage controlled oscillator so as to provide RF signals in the range from about 2.25 to about 18.0 GHz.

7. The digitally tuned synthesizer according to claim 6 further comprising a series of filters and couplers interconnected to said series of frequency multipliers.

8. The digitally tuned synthesizer according to claim 6, wherein said frequency multipliers are frequency doublers.

9. The digitally tuned synthesizer according to claim 4, wherein said digitally tuned synthesizer has six segment bands A, B, C, D, E and F specified in GHz and respectively consisting of 2.25–3.1; 3.1–4.5; 4.5–6.2; 6.2–9.0; 9.0–12.4; and 12.4–18.0.

10. The digitally tuned synthesizer according to claim 1, wherein said output of said coupler connected to said first input of said sampling downconverter has a frequency range of from about 2.25–4.5 GHz and wherein said sampling signal is generated by a clocking source having an output that is filtered.

11. The digitally tuned synthesizer according to claim 10, wherein said clocking source is selected from the group consisting of a temperature controlled crystal oscillator and a numerically controlled oscillator.

12. The digitally tuned synthesizer according to claim 11, wherein said clocking source generates an output signal of 30 MHz.

13. The digitally tuned synthesizer according to claim 12, wherein said filtering is selected from the group of filters consisting of 60.00 MHz and 64.13 MHz filters.

14. The digitally tuned synthesizer according to claim 1 further comprising:

A quadrature (quad) hybrid circuit interposed between said sampling downconverter and said frequency measuring circuit and receiving said beat frequency serving as an Intermediate Frequency (IF) signal output of said sampling downconverter and generating in-phase and quadrature components; and wherein said frequency measuring circuit comprises:

a dual analog to digital converter receiving said in-phase and quadrature components and respectively generating digitized in-phase signals representative of the Sine of said IF signal and digitized quadrature signals representative of the cosine of said IF signal;

an Arc Tan circuit receiving the digitized in-phase signals and digitized quadrature signals and generating a stream of digital phase data;

a circuit for measuring adjacent digital phase data; and a circuit for comparing said adjacent digital phase data against a command frequency reference and generating an output representative of the difference between said adjacent digital phase data and said command frequency reference and comprising said output of said frequency measuring circuit.

* * * * *